United States Patent
Huang et al.

(10) Patent No.: US 8,847,396 B2
(45) Date of Patent: Sep. 30, 2014

(54) SEMICONDUCTOR INTEGRATED CIRCUIT AND FABRICATING THE SAME

(71) Applicant: Taiwan Semiconductor Manufacturing Company, Ltd., Hsin-Chu (TW)

(72) Inventors: Hsin-Yen Huang, Yonghe (TW); Yu-Sheng Chang, Taipei (TW); Hai-Ching Chen, Hsinchu (TW); Tien-I Bao, Dayuan Township, Taoyuan County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/744,781

(22) Filed: Jan. 18, 2013

(65) Prior Publication Data
US 2014/0203434 A1   Jul. 24, 2014

(51) Int. Cl.
*H01L 23/48* (2006.01)
*H01L 21/4763* (2006.01)
*H01L 23/532* (2006.01)
*H01L 21/768* (2006.01)

(52) U.S. Cl.
CPC ........ *H01L 21/7682* (2013.01); *H01L 23/5329* (2013.01)

USPC .......................................... 257/762; 438/618

(58) Field of Classification Search
CPC ............ H01L 21/768; H01L 21/76816; H01L 21/76838; H01L 21/28026; H01L 21/823475; H01L 21/823871; H01L 23/552; H01L 25/16; H01L 27/14636; H01L 2224/19; H01L 2224/25; H01L 2225/06541
USPC .......... 257/751, 741, 773, 762, 522; 438/597, 438/637, 627, 633, 619, 780, 639, 692
See application file for complete search history.

(56) References Cited

U.S. PATENT DOCUMENTS

2011/0291281 A1* 12/2011 Huang et al. .................. 257/762

* cited by examiner

*Primary Examiner* — Whitney T Moore
*Assistant Examiner* — Moin Rahman
(74) *Attorney, Agent, or Firm* — Haynes and Boone, LLP

(57) ABSTRACT

A method of fabricating a semiconductor integrated circuit (IC) is disclosed. The method includes receiving a precursor. A decomposable polymer layer (DPL) is deposited between the conductive features of the precursor. The DPL is annealed to form an ordered periodic pattern of different types of polymer nanostructures. One type of polymer nanostructure is decomposed by a first selectively to form a trench. The trench is filled by a dielectric layer to form a dielectric block. The remaining types of polymer nanostructures are decomposed by a second selectively etching to form nano-air-gaps.

21 Claims, 7 Drawing Sheets

SEMICONDUCTOR INTEGRATED CIRCUIT AND FABRICATING THE SAME

BACKGROUND

The semiconductor integrated circuit (IC) industry has experienced exponential growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. When a semiconductor device such as a metal-oxide-semiconductor field-effect transistor (MOSFET) is scaled down through various technology nodes, interconnects of conductive lines and associated dielectric materials that facilitate wiring between the transistors and other devices play a more important role in IC performance improvement. Although existing methods of fabricating IC devices have been generally adequate for their intended purposes, they have not been entirely satisfactory in all respects. For example, challenges rise to develop a more robust dielectric and metal interconnection structures and processes. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
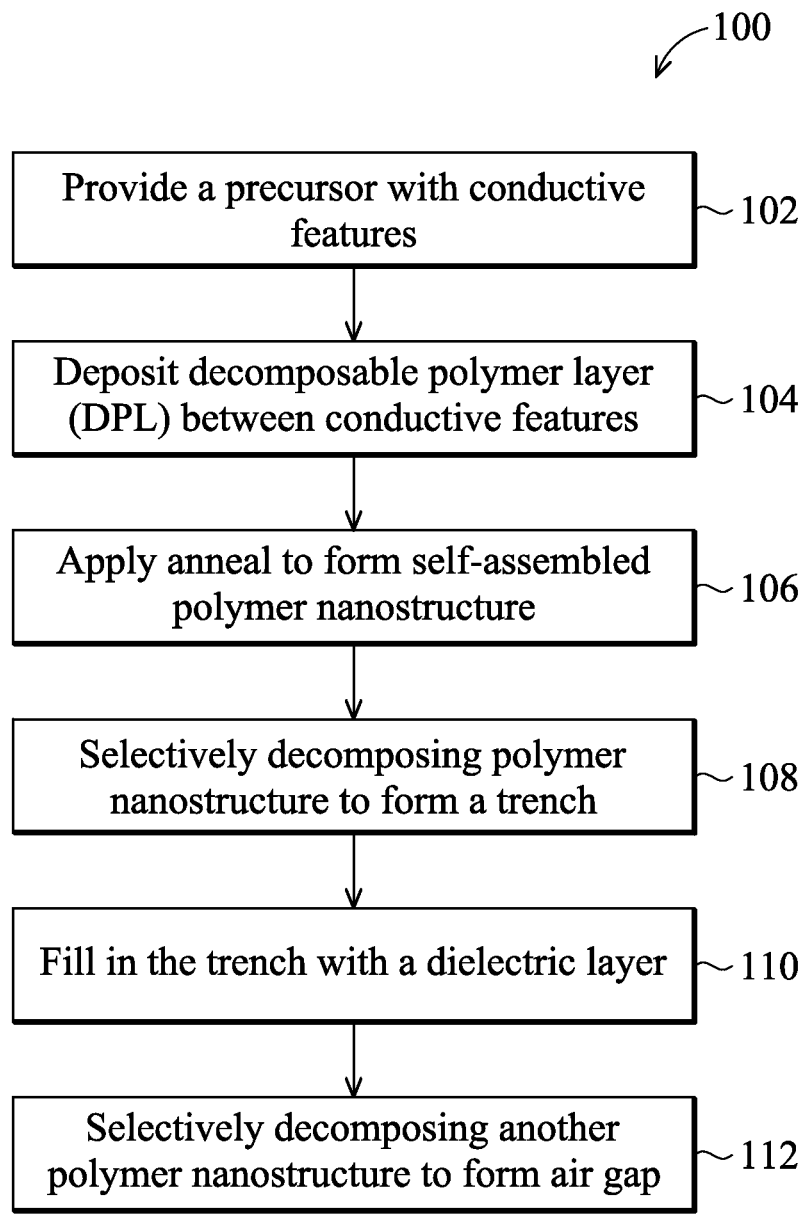
FIG. 1 is a flowchart of an example method for fabricating a semiconductor integrated circuit (IC) constructed according to various aspects of the present disclosure.

FIG. 1 is a flowchart of a method 100 of fabricating one or more semiconductor devices according to aspects of the present disclosure. The method 100 is discussed in detail below, with reference to a semiconductor device precursor 200 and a semiconductor device 800, shown in FIGS. 2 to 7B for the sake of example.

Figure 2:
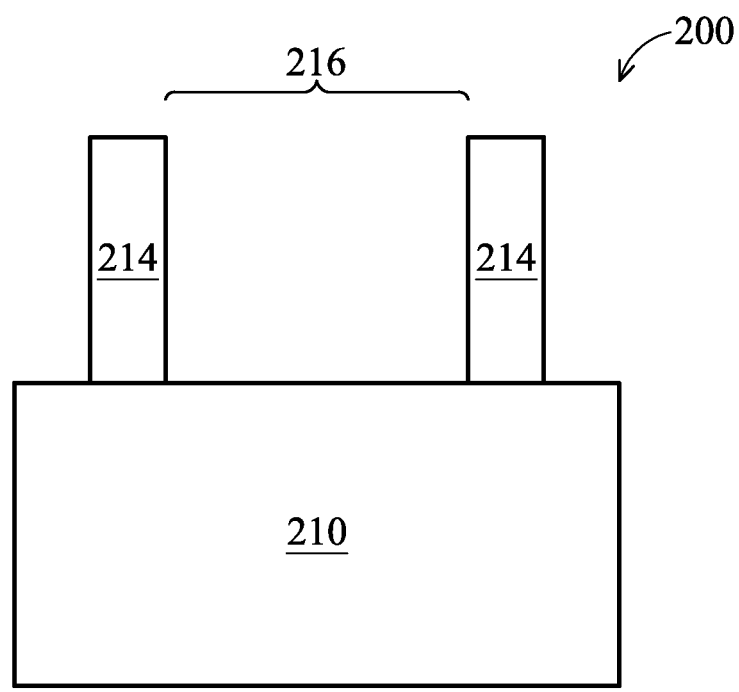
FIG. 2 is a cross sectional view of a precursor according to various aspects of the present disclosure.
Figure 3A:
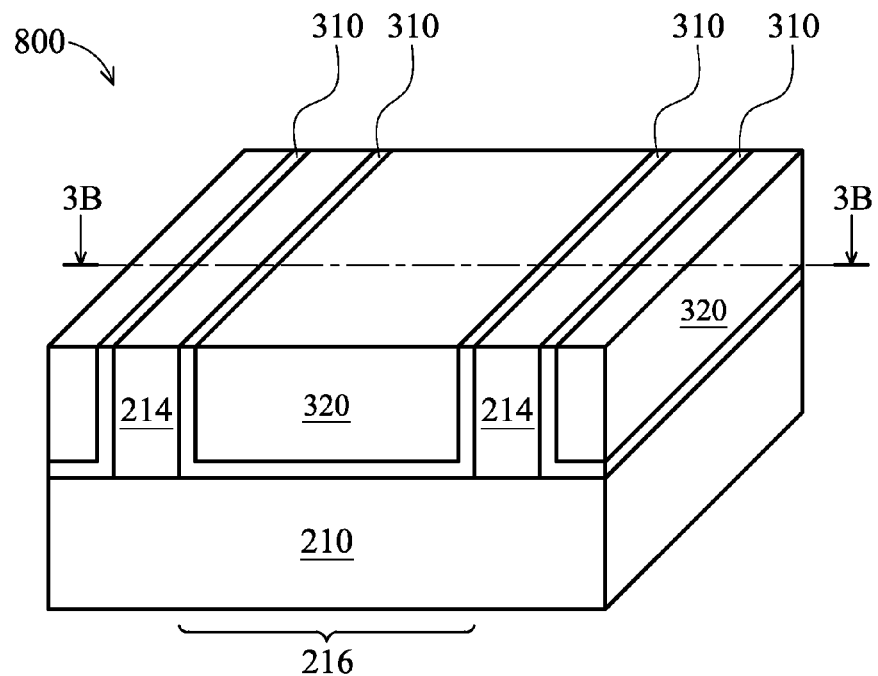
FIGS. 3A, 4A, 5A, 6A and 7A are side-perspective views of an IC device to various aspects of the present disclosure.
Figure 3B:
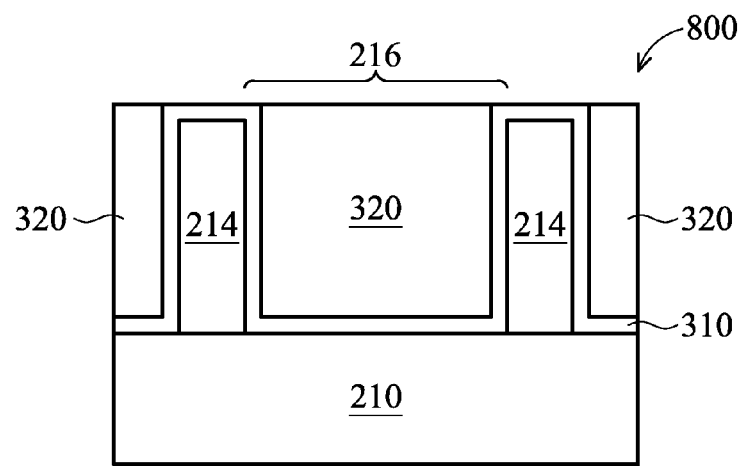
FIG. 3B is a cross sectional view of the IC device along line 3B-3B in FIG. 3A.

Referring to FIGS. 1-2, the method 100 begins at step 102 by receiving a device precursor 200. The device precursor 200 includes a semiconductor substrate 210, such as a silicon wafer. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The device precursor 200 may also include isolation features formed to isolate active regions of the substrate 210. The isolation features may include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The device precursor 200 may also include gate stacks formed by dielectric layers and electrode layers on the substrate 210. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, or other suitable process.

The device precursor 200 may also include a plurality of inter-level dielectric (ILD) layers. The ILD layers include a dielectric material layer, such as silicon oxide, silicon nitride, a dielectric material layer having a dielectric constant (k) lower than thermal silicon oxide (therefore referred to as low-k dielectric material layer), or other suitable dielectric material layer. A process of forming the ILD layer may utilize spin-on coating or chemical vapor deposition (CVD).

The device precursor 200 also includes conductive features 214 formed on and/or extending above the substrate 210 and having a space 216 between each conductive feature. The conductive features 214 include a portion of the interconnect structure. For example, the conductive features 214 include contacts, metal vias, or metal lines. The conductive features 214 may include aluminum (Al), copper (Cu) or tungsten (W). In one embodiment, the conductive features 214 are further surrounded by a barrier layer to prevent diffusion and/or provide material adhesion. The barrier layer may include titanium nitride (TiN), tantalum nitride (TaN), tungsten nitride (WN), titanium silicon nitride (TiSiN) or tantalum silicon nitride (TaSiN). The conductive features 214 (and the barrier layer) may be formed by a procedure including lithography, etching and deposition. In another embodiment, the conductive features 214 include copper lines. In yet another embodiment, the conductive features 214 include electrodes, capacitors, resistors or a portion of a resistor. Alternatively, the conductive features 214 may include doped regions (such as sources or drains), or gate electrodes. In another example, the conductive features 214 are silicide features disposed on respective sources, drains or gate electrodes Referring to FIGS. 1 and 3A-3B, the method 100 proceeds to step 104 by depositing a decomposable polymer layer (DPL) 320 on the space 216 between the conductive features 214. In one embodiment, the DPL 320 includes block co-polymer (BCP). BCP are long-chain molecules comprised of at least two different segments and these segments can assemble themselves into highly ordered structures under a certain condition, such as when they are exposed to an elevated temperature. The BCP 320 may one or more of polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA). The BCP 320 may be deposited by spin-on coating, spraying, dip coating, or other suitable depositions. In one embodiment, the BCP 320 includes a bi-block polymer PS-b-PMMA deposited by spin-on coating. Additionally, prior to deposition of the BCP 320, a neutralize layer (NL) 310 is deposited over the substrate 210 in the space 216. The NL 310 includes materials that having a surface energy which is in a middle of the two components in the BCP. As an example, the NL 310 includes silicon oxide or spin-on-glass (SOG). The NL 310 may be deposited by ALD, CVD or spin-on coating.

Figure 4A:
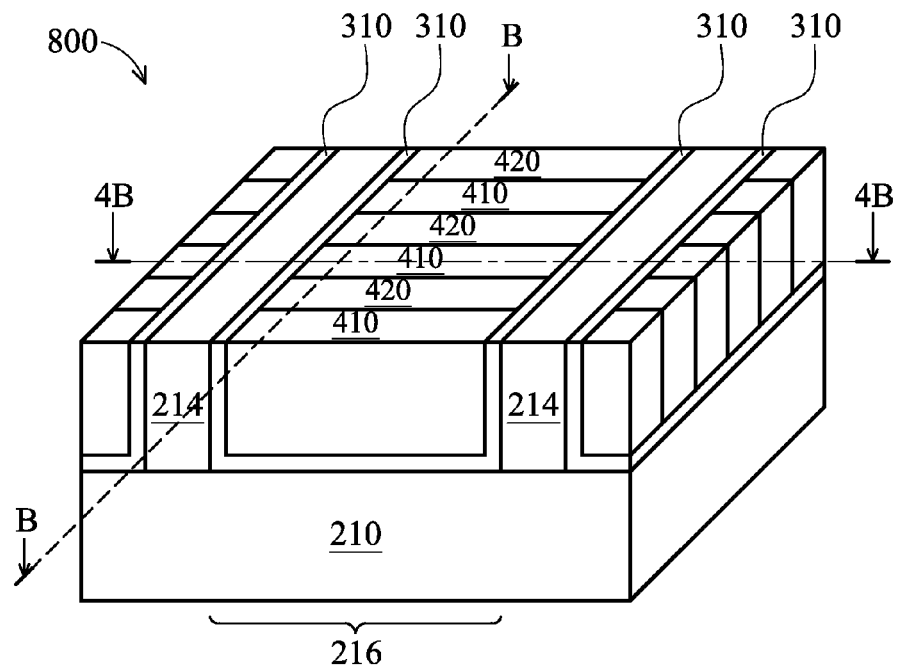
Figure 4B:
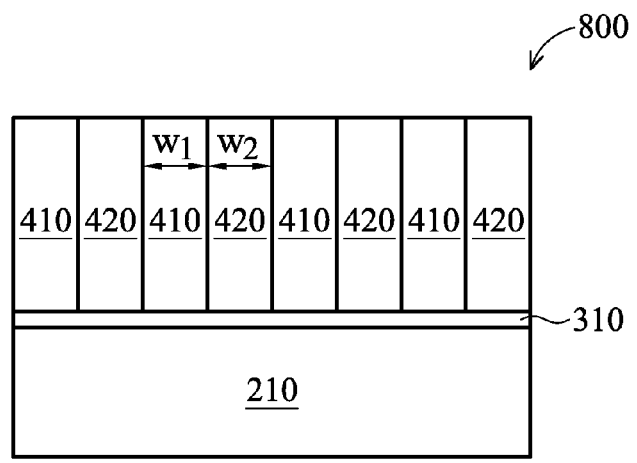
FIG. 4B is a cross sectional view of the IC device along line 4B-4B in FIG. 4A.

Referring to FIGS. 1 and 4A-4B, the method 100 proceeds to step 106 by applying an elevated temperature anneal to the DPL 320 to form highly ordered periodic polymer nanostructures, a first and second polymer nanostructure 410 and 420, on the space 216 between the conductive features 214. The first and second polymer nanostructures 410 and 420 have a first width ($w_1$) and second width ($w_2$) respectively. In one embodiment, the BCP 320 having two polymeric units is annealed with a first temperature of about 250° C. and forms two highly ordered self-assembling polymer nanostructures (polymer blocks), 410 and 420, with a repeating periodical pattern. In one embodiment, the width $w_1$ and width $w_2$ are less than 100 nm. For example, the width $w_1$ and width $w_2$ are about 40 nm. The self-assembling polymer blocks 410 and 420 are aligned one by one, along B-B direction of the FIG. 4A, which is perpendicular to the conductive feature 214, between the conductive features 214. As an example, the PS-b-PMMA 320 is annealed and formed self-assembling polymer block, PS 410 and PMMA 420, with a periodical pattern of repeating themselves between conductive features 214.

Figure 5A:
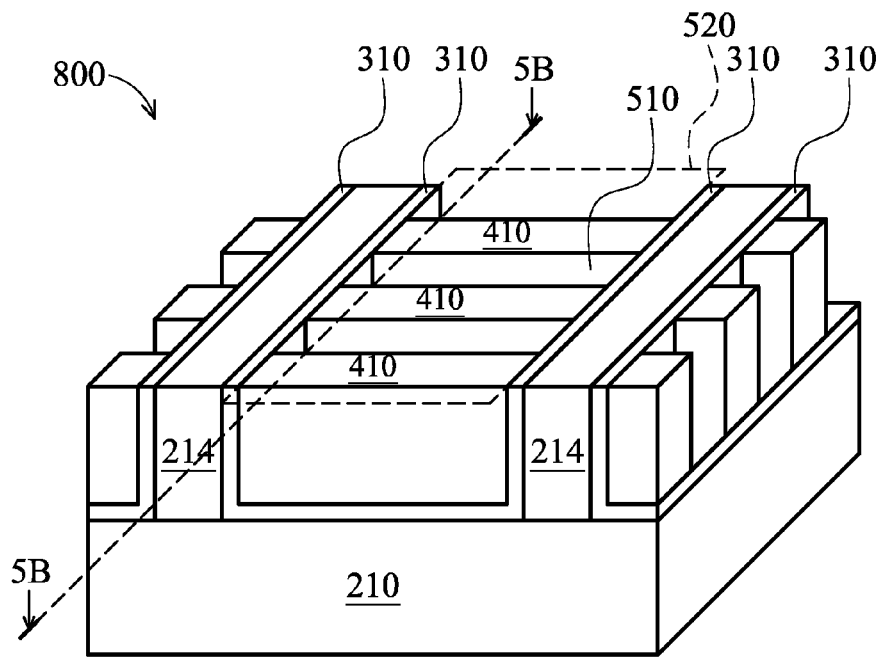
Figure 5B:
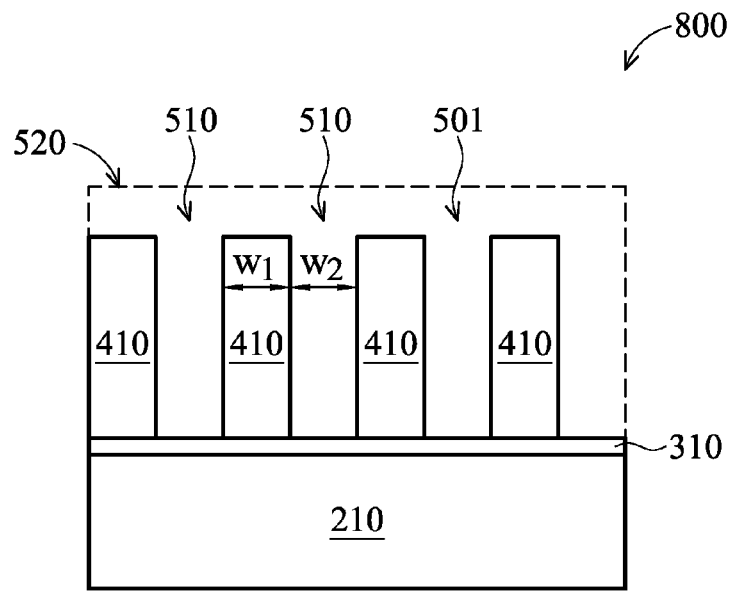
FIG. 5B is a cross sectional view of the IC device along line 5B-5B in FIG. 5A.

Referring to FIGS. 1 and 5A-5B, the method 100 proceeds to step 108 by selectively decomposing a predetermined type of polymer nanostructures, such as the second polymer nanostructures 420, to form a trench 510 between the remaining other different types of polymer nanostructures, such as the polymer block 410. A width of the trench 510 is same as the width $w_2$. A template 520 is formed with a highly ordered repeating periodic pattern of the trench 510 and the first polymer nanostructure 410. The selective decomposition includes dry etch, wet etch, or combinations thereof. As an example, the polymer block 420 of PMMA is decomposed by oxygen plasma etch and the template 520 is formed with a periodic pattern of repeating of the polymer block 410 of PS and the trench 510.

Figure 6A:
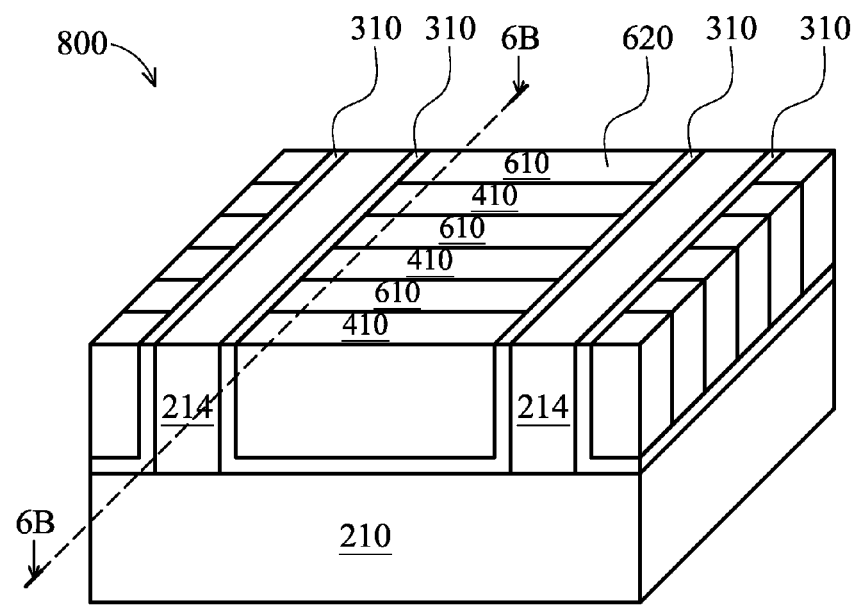
Figure 6B:
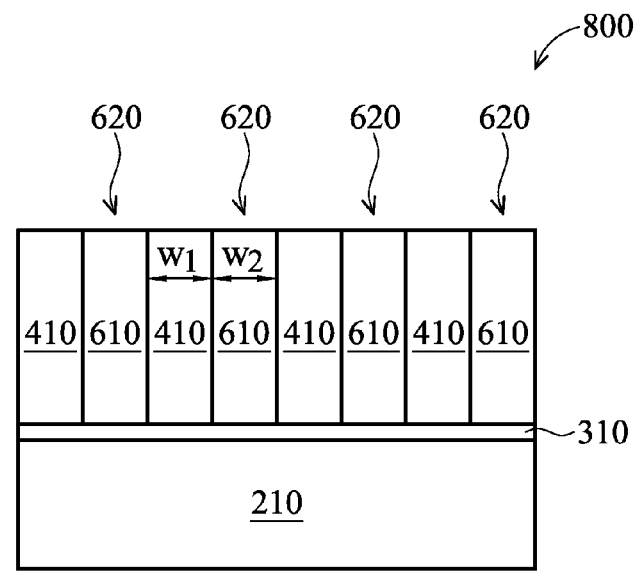
FIG. 6B is a cross sectional view of the IC device along line 6B-6B in FIG. 6A.

Referring to FIGS. 1 and 6A-6B, the method 100 proceeds to step 110 by filling in the trenches 510 with a dielectric layer 610. The dielectric layer 610 includes dielectric materials, such as silicon oxide, silicon nitride, a dielectric material having a dielectric constant (k) lower than thermal silicon oxide (therefore referred to as low-k dielectric material layer), or other suitable dielectric material layer. In various examples, the low k dielectric material may include fluorinated silica glass (FSG), carbon doped silicon oxide, amorphous fluorinated carbon, Parylene, BCB (bis-benzocyclobutenes), SiLK (Dow Chemical, Midland, Mich.), polyimide, and/or other materials as examples. In another example, the low k dielectric material may include an extreme low k (XLK) dielectric material. A process of forming the dielectric layer 610 may utilize spin-on coating or CVD. In the present embodiment, the XLK dielectric layer 610 is filled in the trench 510 in the template 520 by spin-on coating. Additionally a chemical mechanical polishing (CMP) process is performed to remove excessive dielectric layer 610 to form a dielectric block 620 between each first nanostructure 410. A width of the dielectric block 620 is same as the width $w_2$. A top surface of the first nanostructure 410 may be also exposed by the CMP process.

Figure 7A:
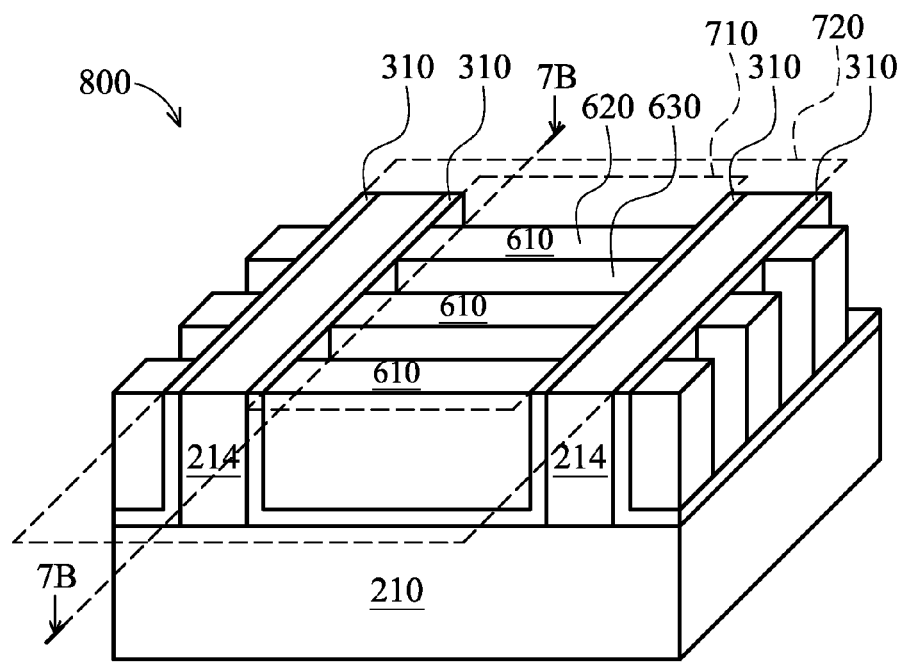
Figure 7B:
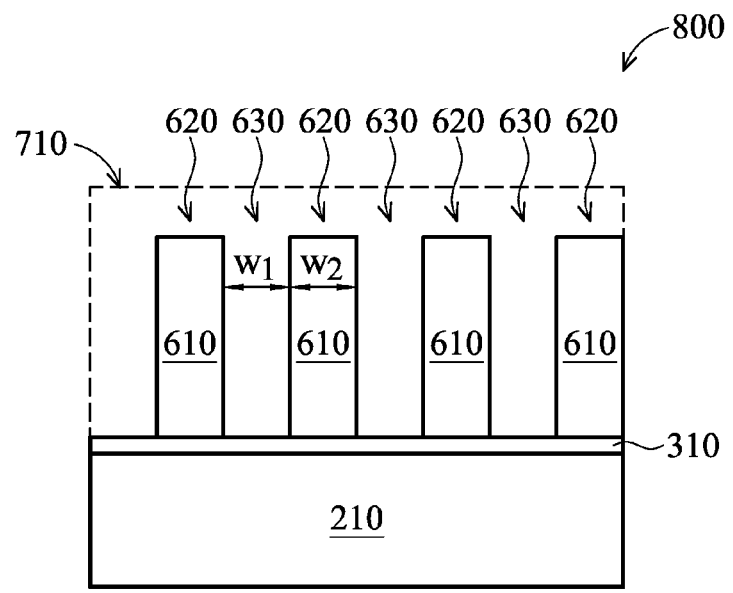
FIG. 7B is a cross sectional view of the IC device along line 7B-7B in FIG. 7A.

Referring to FIGS. 1 and 7A-7B, the method 100 proceeds to step 112 by selectively decomposing the remaining other types polymer nanostructures, such as the first polymer nanostructure 410, to form a nano-air-gap 630 between the dielectric block 620. A width of the nano-air-gap 630 is same as the width $w_1$. The selective decomposition includes anneal, dry etch, wet etch, or any other suitable processes. In one embodiment, the PS polymer block 410 is decomposed by receiving an elevated temperature anneal with a second temperature. The second temperature is substantial higher than the first temperature. As an example, the second temperature is about 350° C. In another embodiment, the PS polymer block 410 is decomposed by a wet etch containing solutions of sulfuric acid (H2SO4) and peroxide (H2O2).

With the dielectric block 620 and the nano-air-gap 630, a dielectric matrix 710 is formed to provide electronic isolation for conductive features. The dielectric matrix 710 is configured with a highly ordered periodic pattern of repeating of the dielectric block 620 and the nano-air-gap 630. The dielectric matrix 710 is integrated with the conductive features 214 to provide an interconnection 720 to couple functional features, such as gate electrodes, various p-type and n-type doped regions, resulting a functional integrated circuit. In one example, the interconnection 720 provides an electrical routing to couple various devices in the substrate 210 to the input/output power and signals. The interconnection 720 may include various metal lines, contacts and via features (or via plugs). The metal lines provide horizontal electrical routing. The contacts provide vertical connection between silicon substrate and metal lines while via features provide vertical connection between metal lines in different metal layers.

Additional steps can be provided before, during, and after the method 100, and some of the steps described can be replaced, eliminated, or moved around for additional embodiments of the method 100.

Based on the above, the present disclosure offers methods for fabricating IC device. The method provides an ordered nano-air-gap formation for interconnection of an IC device. The method employs self-assembling polymer blocks formation and decomposition to form a template of nanostructure. The method provides a robust LK/metal interconnection structure and its fabrication.

The present disclosure provides many different embodiments of fabricating a semiconductor IC that provide one or more improvements over other existing approaches. In one embodiment, a method for fabricating a semiconductor integrated circuit (IC) includes receiving a precursor. The precursor includes a substrate, conductive features extending above the substrate and a space between conductive features. The method also includes depositing a decomposable polymer layer (DPL) on the space between the conductive features on the precursor, annealing the DPL to form an ordered periodic pattern of different types of polymer nanostructures between the conductive features, performing a first selectively etching to decompose a predetermined type of the polymer nanostructures to form a trench and also to form a template with a ordered periodic pattern of repeating of the trench and remaining other types of nanostructures between conductive features, filling in the trench with a dielectric layer to form a dielectric block and performing a second selectively etching to decompose the remaining types of the polymer nanostructures to form a dielectric matrix of nano-air-gaps and the dielectric block between constructive features.

In another embodiment, a method for fabricating a semiconductor IC includes receiving a precursor. The precursor includes a substrate, conductive features extending above the substrate and a space between conductive features. The method also includes depositing a neutralize layer (NL) on the space between the conductive features, depositing a block co-polymer (BCP) layer on the NL, annealing the BCP layer with a first temperature to form a ordered periodic pattern of a first and second polymer blocks on the space between the conductive features, performing a first selectively etching to decompose the first polymer block to form a trench and a template with a ordered periodic pattern of repeating of the trench and the first polymer block, filling in the trench with a dielectric layer to form a dielectric block and performing a second selectively etching to decompose the first polymer block to form a dielectric matrix with nano-air-gaps and the dielectric blocks.

In yet another embodiment, a semiconductor IC includes a substrate, conductive features extending above the substrate and a dielectric matrix with an ordered periodic nano-air-gap and a dielectric block, aligned perpendicularly to the conductive features, between conductive features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor integrated circuit (IC), the method comprising:
   receiving a precursor, the precursor including:
      a substrate;
      conductive features extending above the substrate; and
      a space between the conductive features;
   depositing a decomposable polymer layer (DPL) in the space between the conductive features on the precursor;
   annealing the DPL to form an ordered periodic pattern of different types of polymer nanostructures between the conductive features;
   performing a first selective etch to decompose a first type of the polymer nanostructures to form a trench and a template with the ordered repeating periodic pattern of the trench and a second type of polymer nanostructures between conductive features;
   filling in the trench with a dielectric layer to form a dielectric block; and
   performing a second selectively etching to decompose the second type of polymer nanostructures to form a dielectric matrix of nano-air gaps and the dielectric block between constructive features.

2. The method of claim 1, wherein the conductive features include copper lines.

3. The method of claim 1, wherein the DPL includes a block co-polymer (BCP) layer.

4. The method of claim 3, wherein the BCP layer includes one or more materials from the group consisting of polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA).

5. The method of claim 3, wherein first and second polymer blocks are formed by annealing to the BCP layer with a first temperature.

6. The method of claim 5, wherein the first and second polymer blocks include a PS block and a PMMA block.

7. The method of claim 6, wherein the PMMA block is decomposed by oxygen plasma etch.

8. The method of claim 5, wherein the PS block is decomposed by annealing with a second temperature.

9. The method of claim 8, wherein the second temperature is substantial higher than the first temperature.

10. The method of claim 3, further comprising:
depositing a neutralize layer (NL) prior to depositing the BCP layer.

11. The method of claim 1, wherein the nano-air gap is formed with a width that is less than 100 nm.

12. The method of claim 1, wherein the trench is filled by a low k (LK) dielectric material.

13. A method for fabricating a semiconductor integrated circuit (IC), the method comprising:
receiving a precursor, the precursor including a substrate, conductive features extending above the substrate, and a space between conductive features;
depositing a neutralize layer (NL) on the space between the conductive features;
depositing a block co-polymer (BCP) layer over the NL;
annealing the BCP layer with a first temperature to form an ordered periodic pattern of a first and second polymer blocks on the space between the conductive features;
performing a first selective etch to decompose the second polymer block to form a trench and a template with an ordered periodic repeating pattern of the trench and the first polymer block;
filling in the trench with a dielectric layer to form a dielectric block; and
performing a second selective etch to decompose the first polymer block to form a dielectric matrix with nano-air gaps and the dielectric blocks.

14. The method of claim 13, wherein the BCP layer includes one or more materials from the group consisting of polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA).

15. The method of claim 13, wherein the first selective etch includes oxygen plasma etch.

16. The method of claim 13, wherein the second selective etch includes an annealing with a second temperature, which is substantially higher than the first temperature.

17. The method of claim 13, wherein the second selective etch includes a wet etch containing solutions of sulfuric acid (H2SO4) and peroxide (H2O2).

18. A method for fabricating a semiconductor integrated circuit (IC), the method comprising:
receiving a substrate
forming conductive features above the substrate, with a space between the conductive features;
depositing a neutralize layer (NL) in the space between the conductive features;
depositing a decomposable polymer layer (DPL) over the NL;
annealing the DPL;
performing a first selective etch of the annealed DPL to form a trench;
filling in the trench with a dielectric layer; and
performing a second selectively etching to form a dielectric matrix of nano-air gaps.

19. The method of claim 18, wherein the DPL includes a block co-polymer (BCP).

20. The method of claim 18, wherein the DPL includes a block co-polymer (BCP).

21. The method of claim 18, wherein the dielectric layer forms a dielectric block.

* * * * *